(12) United States Patent
Suemasa et al.

(10) Patent No.: US 6,683,790 B1
(45) Date of Patent: Jan. 27, 2004

(54) ELECTRONIC PART, DIELECTRIC FILTER, DIELECTRIC DUPLEXER, AND MANUFACTURING METHOD OF THE ELECTRONIC PART

(75) Inventors: Hajime Suemasa, Ishikawa-ken (JP); Takashi Maruyama, Kanazawa (JP)

(73) Assignee: Murata Manufacturing Co., Ltd., Kyoto-fu (JP)

( * ) Notice: Subject to any disclaimer, the term of this patent is extended or adjusted under 35 U.S.C. 154(b) by 0 days.

(21) Appl. No.: 09/606,963

(22) Filed: Jun. 29, 2000

(30) Foreign Application Priority Data

Jun. 30, 1999 (JP) .......................... 11-185354
May 11, 2000 (JP) ....................... 2000-138254

(51) Int. Cl.$^7$ ............................................... H05K 7/02
(52) U.S. Cl. ........................................ 361/760; 361/765
(58) Field of Search ..................... 361/760, 752, 361/753, 761, 764, 765, 772, 777, 704; 439/76.2; 438/667, 637; 257/774; 174/260–263

(56) References Cited

U.S. PATENT DOCUMENTS

| | | | |
|---|---|---|---|
| 2,695,351 A | | 11/1954 | Beck |
| 4,320,165 A | * | 3/1982 | Cash ........................... 29/620 |
| 5,083,237 A | * | 1/1992 | Tsuji ........................... 361/402 |
| 5,147,982 A | * | 9/1992 | Steffen ....................... 174/52.2 |
| 5,517,162 A | | 5/1996 | Ariyoshi |
| 5,612,512 A | | 3/1997 | Wakamatsu et al. |
| 5,656,550 A | * | 8/1997 | Tsuji et al. ................. 438/123 |
| 5,707,714 A | * | 1/1998 | Furutatsu et al. ........... 428/209 |
| 5,760,666 A | | 6/1998 | Tada et al. |
| 5,815,919 A | * | 10/1998 | Nakanishi et al. ............ 29/840 |
| 5,962,917 A | * | 10/1999 | Moriyama ................... 257/697 |
| 6,128,199 A | * | 10/2000 | Kambara ..................... 361/760 |
| 6,184,133 B1 | * | 2/2001 | Iijima et al. ................. 438/667 |
| 6,185,105 B1 | * | 2/2001 | Inoguchi ..................... 361/760 |
| 6,348,852 B1 | * | 2/2002 | Kojima et al. ............ 338/22 R |
| 6,356,170 B1 | * | 3/2002 | Arakawa et al. ............ 333/208 |
| 6,359,546 B1 | * | 3/2002 | Oh .............................. 338/309 |

FOREIGN PATENT DOCUMENTS

JP  5-206606  8/1993

OTHER PUBLICATIONS

Abstract of JP 02022886.
Abstract of JP 09186430.
Abstract of JP 07212104.
Abstract of JP 05206606.
Abstract of JP 05211280.
Abstract of JP 11126795.

* cited by examiner

Primary Examiner—Michael Sherry
Assistant Examiner—Thanh S. Phan
(74) Attorney, Agent, or Firm—Dickstein, Shapiro, Morin & Oshinsky, LLP.

(57) ABSTRACT

An electronic part comprising: a printed circuit board including a first major surface and a second major surface; a circuit element disposed on the first major surface of the printed circuit board; a terminal electrode disposed on the second major surface of the printed circuit board and including a major surface opposed to the second major surface of the printed circuit board; a soldering-resistant film disposed on the second major surface of the printed circuit board and including a major surface opposed to the second major surface of the printed circuit board; wherein the distance between the major surface of the terminal electrode and the second major surface of the printed circuit board is substantially equal to or larger than the distance between the major surface of the soldering-resistant film in the vicinity of the terminal electrode and the second major surface of the printed circuit board.

5 Claims, 7 Drawing Sheets

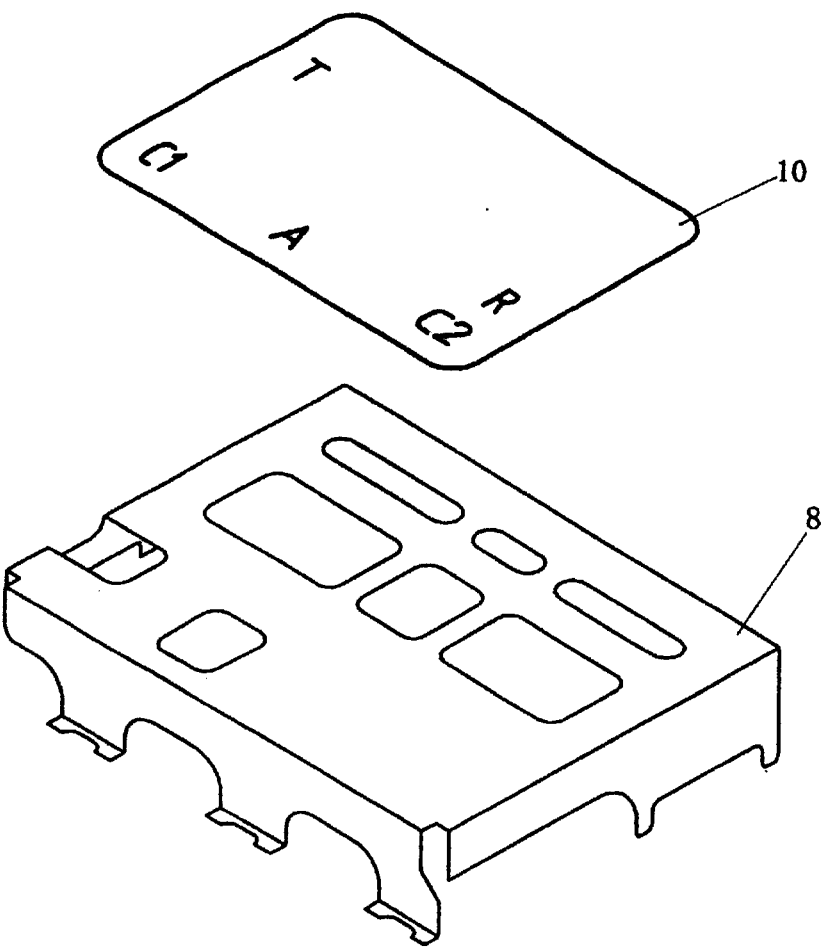
Fig. 1
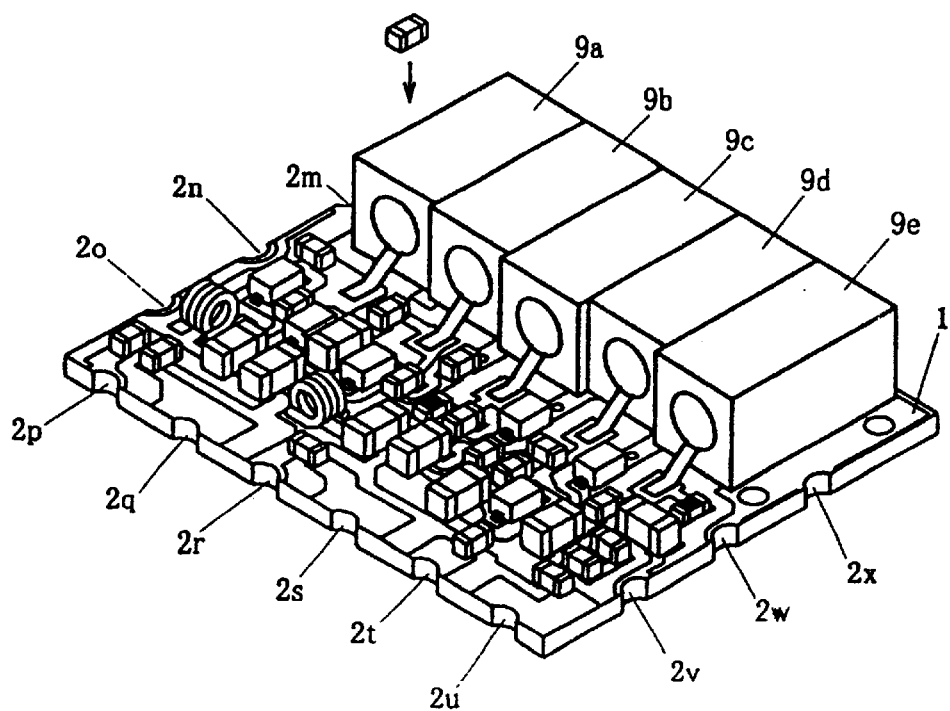

FIG 2A
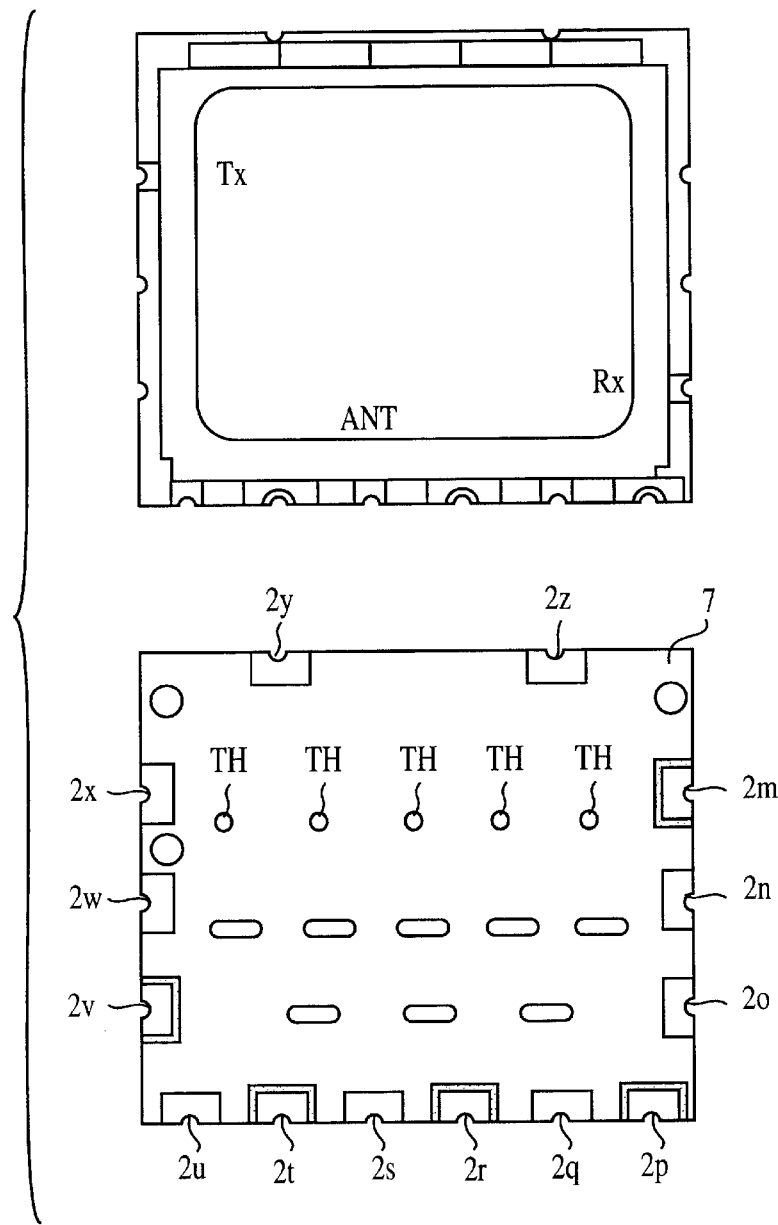
FIG. 2B
FIG. 3
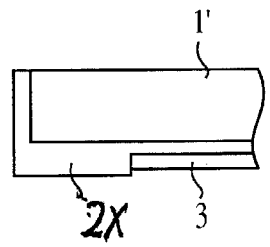

ELECTRONIC PART, DIELECTRIC FILTER, DIELECTRIC DUPLEXER, AND MANUFACTURING METHOD OF THE ELECTRONIC PART

BACKGROUND OF THE INVENTION

1. Field of the Invention

This invention relates to an electronic part in which a circuit element is mounted on the major surface of a printed circuit board, dielectric filter, dielectric duplexer, and manufacturing method of the electronic part.

2. Description of the Related Art

Up to now, in an electronic part where a plurality of chip parts, etc. are put together into a component which functions as a fixed circuit, circuit elements of chip-like elements and others are mounted on the upper surface (first major surface) of a printed circuit board and terminal electrodes are formed on the lower surface (second major surface) of the printed circuit board.

For example, when one dielectric duplexer is constructed of a plurality of coaxial dielectric resonators, terminal $T_x$ to input a transmission signal from a transmission circuit, terminal $R_x$ to output a reception signal to a reception circuit, terminal ANT to connect an antenna, and others are provided on the lower surface of a printed circuit board, chip capacitors and coils are mounted together with a plurality of coaxial dielectric resonators on the upper surface on the printed circuit board, and a shield cover is set in the upper part.

FIG. 10 is a sectional view of a terminal electrode in the above conventional electronic part. However, the hatching or the like indicating the section is omitted in order to show the drawing clearly. In FIG. 10, reference numeral 1 represents the base material of a printed circuit board. At a fixed location of the base material 1, a terminal electrode is provided in such a way that the main part of the terminal electrode is constructed of a copper foil 21, that a soldering-resistant film 3 is formed in a portion not to be soldered, and that further a plated upper film 23 is formed at a location to be soldered.

However, an electronic part where circuit elements are mounted on a printed circuit board as in the above, has the property that the printed circuit board itself is warped and that the whole printed circuit board is likely to get warped and distorted when the circuit element is mounted on the upper surface of the board by soldering, etc. Therefore, when the above electronic part is mounted on a circuit board of electronic equipment, there was a possibility that a gap is caused between the lower surface of the printed circuit board of the electronic part and the upper surface of the circuit board of electronic equipment and reliable connection may not be performed between the terminal electrodes.

FIG. 11 shows one example of such cases. In FIG. 11, a circuit board 4 of electronic equipment is shown and a terminal electrode 5 is formed on the upper surface of the circuit board. Generally, the terminal electrode 5 of the circuit board is composed of 80 to 150 μm thick printed solder, and as a soldering-resistant film 3 is protruded about 20 μm from a terminal electrode 2 the terminal electrode 2 of the printed circuit board and the electrode 5 of the circuit board make contact with each other. However, as shown in FIG. 11, when the end portion of the printed circuit board 1 is warped so as to leave from the circuit board 4, the terminal electrode 2 of the printed circuit board is lifted out of the terminal electrode 5 of the circuit board which is likely to cause soldering defects.

Furthermore, it is possible to mount electronic parts on the circuit board of electronic equipment by making use of solder bumps formed on the lower surface of a printed circuit board of electronic part, but because of the solder bumps which are about 0.3 to 0.5 mm high a relatively large gap is caused between the printed circuit board and the circuit board 4. Therefore, particularly in the electronic parts such as filters in high-frequency circuits, there was a possibility that such a problem that signals are likely to couple between input-output terminals, that once coupled their attenuation characteristics are deteriorated, and that fixed characteristics cannot be realized after the mounting on the circuit board of electronic equipment is caused.

SUMMARY OF THE PRESENT INVENTION

To overcome the above described problems, preferred embodiments of the present invention provide an electronic part in which even if the printed circuit board of the electronic part is warped or distorted reliable connection takes place between the terminal electrodes of the printed circuit board of the electronic part and the terminal electrodes of the circuit board of electronic equipment, dielectric filter, dielectric duplexer, and manufacturing method of the electronic part.

One preferred embodiment of the present invention provides an electronic part comprising: a printed circuit board including a first major surface and a second major surface; a circuit element disposed on the first major surface of the printed circuit board; a terminal electrode disposed on the second major surface of the printed circuit board and including a major surface opposed to the second major surface of the printed circuit board; a soldering-resistant film disposed on the second major surface of the printed circuit board and including a major surface opposed to the second major surface of the printed circuit board; wherein the distance between the major surface of the terminal electrode and the second major surface of the printed circuit board is substantially equal to or larger than the distance between the major surface of the soldering-resistant film in the vicinity of the terminal electrode and the second major surface of the printed circuit board.

According to the above described structure and arrangement, since the allowance of warping of the printed circuit board of an electronic part increases, even if the printed circuit board is warped to some extent and the terminal electrode is deformed in the direction that the terminal electrode be lifted out of the terminal electrode of the circuit board of electronic equipment, originally there is a margin of the protrusion of the terminal electrode of the printed circuit board from the surface of the soldering-resistant film and accordingly both electrodes are made to be securely connected.

In the above described electronic part, a plurality of coaxial dielectric resonators may be provided as the circuit element, and a signal input-output terminal maybe provided as the terminal electrode thereby constituting a dielectric filter. Further, at least two of the dielectric filters may be provided on the printed circuit board thereby constituting a dielectric duplexer.

Particularly in the construction where coaxial dielectric resonators having a relatively large occupied space to the area of the printed circuit board are mounted, the warping of the printed circuit board generally becomes large compared with electronic parts where only chip parts of small size are mounted, but according to the above arrangement the dielectric filter or dielectric duplexer is made to be securely mounted on the circuit board of electronic equipment.

Another preferred embodiment of the present invention provides a method of manufacturing an electronic part, comprising: mounting a circuit element on the first major surface of a printed circuit board; disposing a terminal electrode on the second major surface of the printed circuit board, the terminal electrode including a major surface opposed to the second major surface of the printed circuit board; disposing a soldering-resistant film on the second major surface of the printed circuit board, the soldering-resistant film including a major surface opposed to the second major surface of the printed circuit board; wherein the terminal electrode is formed by disposing an electrode film on the second major surface of the printed circuit board and etching the electrode film excluding the portion of the terminal electrode; the soldering-resistant film is disposed on the etched portion of the electrode film; and the distance between the major surface of the terminal electrode and the second major surface of the printed circuit board is made substantially equal to or larger than the distance between the major surface of the soldering-resistant film in the vicinity of the terminal electrode and the second major surface of the printed circuit board.

According to the above described method, the surface of a terminal electrode can be highly precisely protruded by etching so as to have the above described distance, and the manufacturing is made easy.

Yet another preferred embodiment of the present invention provides a method of manufacturing an electronic part, comprising: mounting a circuit element on the first major surface of a printed circuit board; disposing a terminal electrode on the second major surface of the printed circuit board, the terminal electrode including a major surface opposed to the second major surface of the printed circuit board; disposing a soldering-resistant film on the second major surface of the printed circuit board, the soldering-resistant film including a major surface opposed to the second major surface of the printed circuit board; wherein the terminal electrode is formed by disposing an electrode film on the second major surface of the printed circuit board and plating the electrode film at the portion of the terminal electrode; the soldering-resistant film is disposed on the electrode film excluding the portion of the terminal electrode; and the distance between the major surface of the terminal electrode and the second major surface of the printed circuit board is made substantially equal to or larger than the distance between the major surface of the soldering-resistant film in the vicinity of the terminal electrode and the second major surface of the printed circuit board.

According to the above described method, the surface of a terminal electrode can be highly precisely protruded by plating so as to have the above described distance.

Other features and advantages of the present invention will become apparent from the following description of the invention which refers to the accompanying drawings.

BRIEF DESCRIPTION OF DRAWINGS

FIG. 1 is an exploded perspective view showing the construction of a dielectric duplexer according to a first embodiment.

FIG. 2A shows the upper surface (first major surface) and FIG. 2B shows the lower surface (second major surface) of the dielectric duplexer.

FIG. 3 is a sectional view of a terminal electrode of the dielectric duplexer.

DESCRIPTION OF THE PREFERRED EMBODIMENTS

Figure 4:
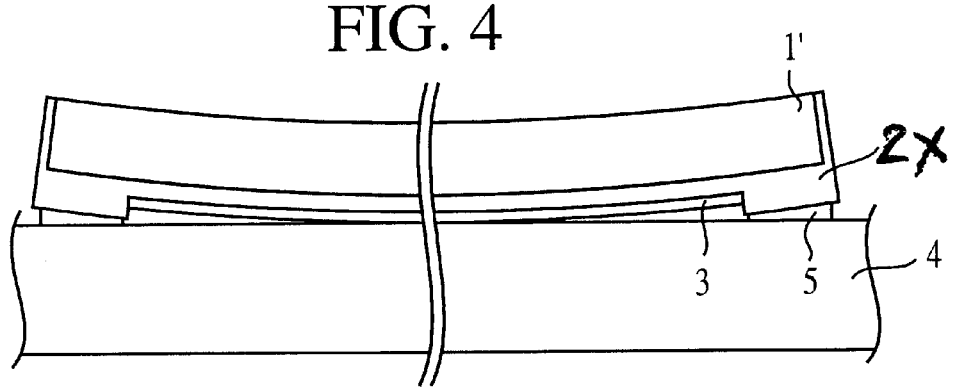
FIG. 4 is a sectional view showing the condition where the dielectric duplexer is mounted on a circuit board.

The construction and manufacturing method of a dielectric duplexer according to a first embodiment of the invention are explained with reference to FIGS. 1 to 5.

FIG. 1 is an exploded perspective view showing the internal construction of a dielectric duplexer. FIG. 1 shows a printed circuit board 1 where electrodes of fixed patterns are provided on the upper and lower surfaces (first and second major surfaces) of the board and electrodes are provided in the portions of through-hole. Further, the circuit elements of coaxial dielectric resonators indicated by 9a to 9e, chip capacitors and coils, etc. are soldered on the upper surface of the printed circuit board 1. The terminal electrodes 2m, 2n, 2o, . . . , 2w, and 2x are formed in the through-holes of a mother board from which the printed circuit board 1 was separated, and on their internal surface an electrode is formed. Further, reference numeral 8 represents a shielding cover, and the cover overspreads the upside of the printed circuit board and shields the whole circuit, fixed locations of the cover being soldered. Reference numeral 10 indicates a name plate showing the name of part, etc. which is stuck on the cover 8.

FIGS. 2A and 2B show the construction of the above dielectric duplexer where FIG. 2A indicates the upper surface and FIG. 2B shows the lower surface. In FIGS. 2A and 2B, reference numeral 7 represents a grounding electrode formed on the lower surface of the printed circuit board 1, and 2m, 2n, 2o, . . . , 2y, and 2z are the terminal electrodes which are continuous with the internal surface of the above-mentioned through-holes, respectively. Here, 2m is used as terminal $T_x$, 2v as terminal $R_x$, and 2r as terminal ANT. Further, the terminal electrodes 2n, 2o, 2q, 2s, 2u, 2w, 2x, 2y, and 2z are continues with the grounding electrode 7. TH shows the through-holes which connect the grounding electrode on the upper surface and the grounding electrode on the lower surface of the printed circuit board 1.

FIG. 3 is partial a sectional view showing one of the above terminal electrodes. However, the hatching indicating the section is omitted in order to show the drawing clearly. This is applicable to each of the sectional views shown in the following. FIG. 3 shows a base material of printed circuit board 1', a terminal electrode 2x provided at a fixed location of the base material, and a soldering-resistant film 3 formed in the area not for soldering. In this way, the lower surface of the terminal electrode 2x is protruded downward so as to be lower than the surface of the soldering-resistant film 3.

FIG. 4 is a sectional view showing the condition where the above-mentioned dielectric duplexer is mounted on a circuit board. However, the coaxial dielectric resonators and other circuit elements shown in FIG. 1, which are mounted on the upper surface of the printed circuit board, are omitted. As shown in this example, even when the printed circuit board 1 is warped to some extent in the direction that the terminal electrode 2x of the printed circuit board 1 be lifted out of the circuit board 4, because the lower surface of the terminal electrode 2x is protruded to the side of the circuit board 4, the terminal electrode 2x is not lifted out of the terminal electrode 5 of the circuit board 4.

When the above printed circuit board 1 is warped in reverse, it is natural that the terminal electrode 2x of the printed circuit board 1 is not lifted out of the terminal electrode 5 on the circuit board 4.

The height of projection of the terminal electrode 2x from the surface of the above-mentioned soldering-resistant film 3 is about −0.1 to 0.1 mm. Therefore, different from the case of connection by the soldering bump, a gap more than needed is not caused between the printed circuit board 1 and the circuit board 4, signals are not coupled between the input-output terminals, and the characteristics of the dielectric duplexer are not changed because of the mounted condition to the circuit board 4.

Next, a concrete constructing method of a terminal electrode is explained on the basis of FIGS. 5A to 5D.

Figure 5A:
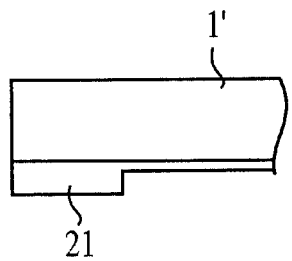
FIGS. 5A, 5B, 5C and 5D show sectional views showing a manufacturing method of the dielectric duplexer.

First, as shown in 5A, a copper foil 21 is glued on the lower surface of a base material 1' of printed circuit board. Or a printed circuit board with a copper foil put thereon is chosen as a starting material. And by etching a fixed thickness excluding the terminal electrode the copper foil is made thinner. Furthermore, FIG. 5A shows a sectional view of the printed circuit board after the etching.

Figure 5B:
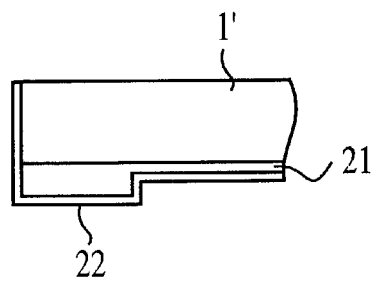

Next, holes are made at the location where through-holes are to be formed, and as shown in FIG. 5B a copper-plated foundation film 22 is formed on the copper foil and the internal surface of the through-hole (the left end surface of the base material 1' in the drawing corresponds to the internal surface of the through-hole).

Figure 5C:
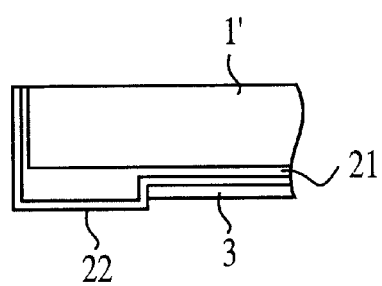

Next, as shown in FIG. 5C, a soldering-resistant film 3 which is about 20 μm in thickness is printed on the portion where soldering is not performed.

Figure 5D:
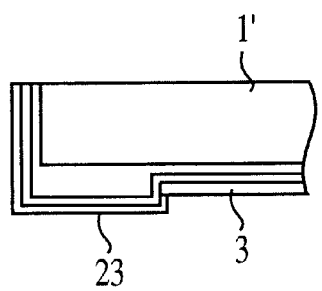

Then, as shown in FIG. 5D, a plated surface film 23 is formed on an exposed copper-plated foundation film. For example, an upper film of gold (Au) plating, silver (Ag) plating, tin (Sn) plating, nickel-gold (Ni—Au) plating, tin-lead (Sn—Pb) plating, etc. is formed.

Next, a manufacturing method of the portion of a terminal electrode of an electronic part according to a second embodiment is explained with reference to FIG. 6.

Figure 6A:
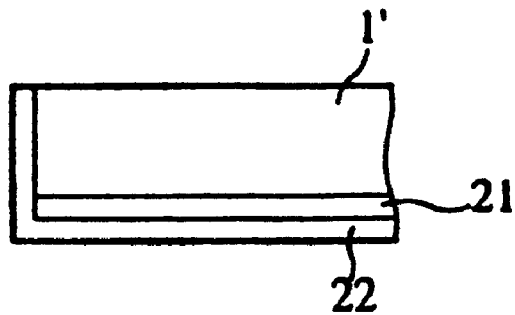
FIGS. 6A, 6B, 6C and 6D show sectional views showing a manufacturing method of an electronic part according to a second embodiment.

FIGS. 6A to 6D show sectional views of a terminal electrode of an electronic part and shows a base material 1' of printed circuit board. First, as shown in FIG. 6A, by forming a copper-plated foundation film 22 on a copper foil glued on the printed circuit board the thickness of the copper foil 21 is increased, and a copper-plated foundation film is formed on the internal surface of a through-hole.

Figure 6B:
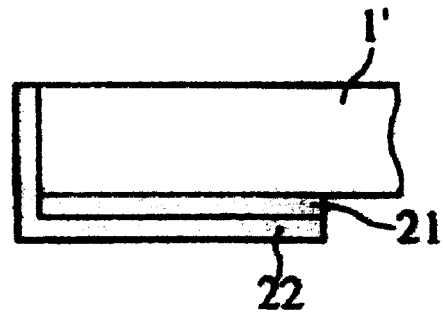

Next, as shown in FIG. 6B, patterning the portion as a terminal electrode is performed. That is, the copper-plated foundation film and copper foil are removed by etching.

Figure 6C:
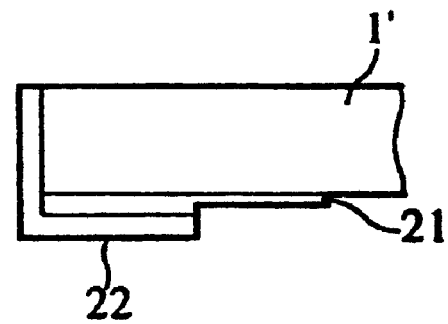

Next, as shown in FIG. 6C, the thickness of the portion excluding the area which is protruded as a terminal electrode is reduced by etching.

Figure 6D:
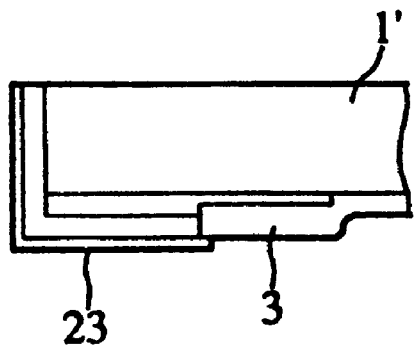

Then, as shown in FIG. 6D a soldering-resistant film 3 is printed and further a plated upper film 23 is formed.

As in the above, a terminal electrode which is protruded downward so as to be lower than the surface of the soldering-resistant film on the lower surface of the printed circuit board is formed.

Figure 7A:
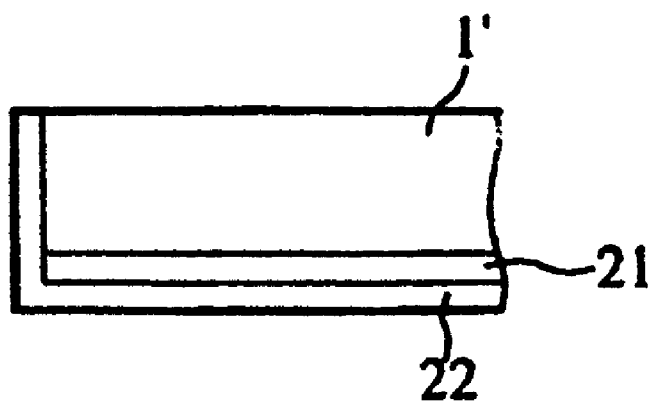
FIGS. 7A, 7B and 7C show sectional views showing a manufacturing method of an electronic part according to a third embodiment.
Figure 7B:
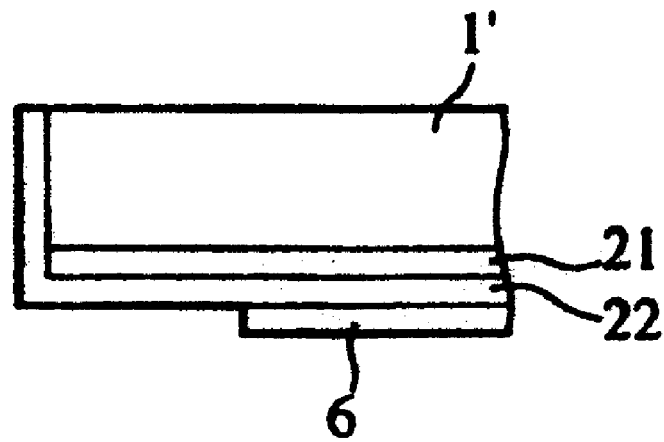
Figure 7C:
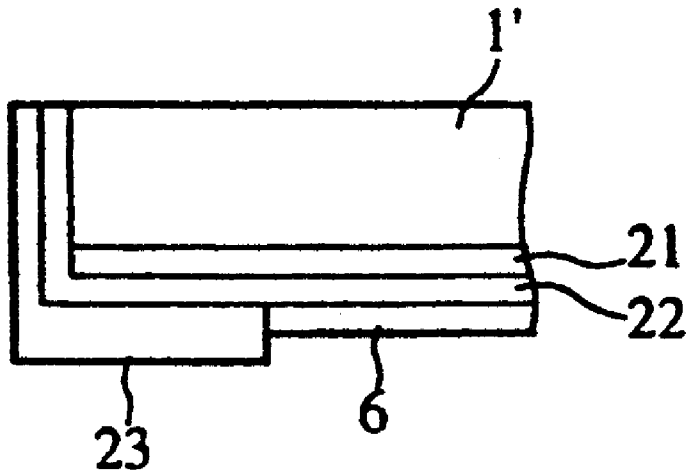

Next, a manufacturing method of a terminal electrode of an electronic part according to a third embodiment with reference to FIGS. 7A to 7C.

FIGS. 7A to 7C show sectional views of the portion of a terminal electrode of an electronic part and shows a base material 1' of printed circuit board. First, as shown in FIG. 7A, by forming a copper-plated foundation film 22 on a copper foil 21 glued on a printed circuit board the thickness of the copper foil 21 is increased, and a copper-plated foundation film is formed on the internal surface of a through-hole.

Next, as shown in FIG. 7B, a plating-resistant film 6 is printed on the area excluding a terminal electrode, and as shown in FIG. 7C a plated upper film 23 is put on the portion which becomes the terminal electrode so as to result in a fixed projection.

Furthermore, the plating-resistannt film 6 may be used as a soldering-resistant film as it is, or after the plating-resistant film 6 has been removed, a soldering-resistant film may be printed on that portion.

Figure 8A:
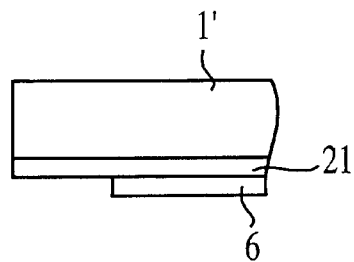
FIGS. 8A, 8B and 8C show sectional views showing a manufacturing method of an electronic part according to a fourth embodiment.
Figure 8B:
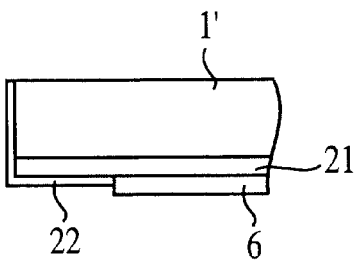
Figure 8C:
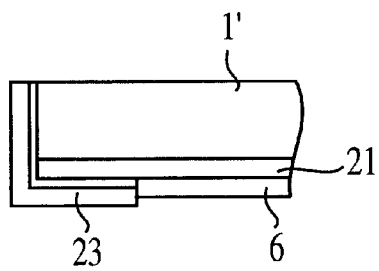

Next, a manufacturing method of a terminal electrode of an electronic part according to a fourth embodiment with reference to FIGS. 8A to 8C.

FIGS. 8A to 8C show sectional views of the portion of a terminal electrode of an electronic part, and reference numeral 1' represents a base material of printed circuit board. First, as shown in FIG. 8A, on a copper foil 21 glued on a printed circuit board a plating-resistant film 6 is formed excluding the portion which becomes the terminal electrode.

In succession, as shown in FIG. 8B, by forming a copper-plated foundation film 22, the thickness of the copper foil 21 is increased and simultaneously a copper-plated foundation film is formed on the internal surface of a through-hole.

Further, as shown in FIG. 8C, a plated upper film 23 is attached to the copper-plated foundation film 22 so as to increase the thickness of the foundation film.

In any of the first to fourth embodiment, the surface of the terminal electrode is smooth and the difference of thickness between terminal electrodes is less than 0.1 mm.

In the above-mentioned examples, the lower surface of the terminal electrodes was always protruded downward from the surface of the soldering-resistant film in the vicinity of the terminal electrode on the lower surface of the printed circuit board, but the lower surface of the terminal electrodes may be nearly as low as the surface of the soldering-resistant film. The example is shown in FIG. 9.

Figure 9:
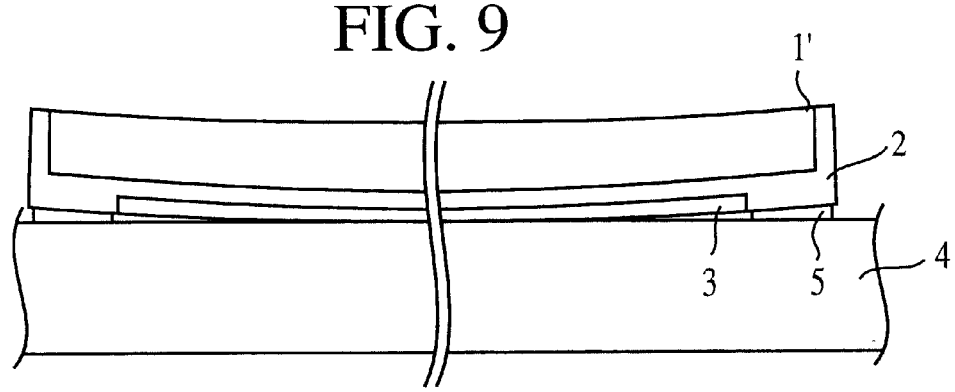
FIG. 9 is a sectional view showing the condition where an electronic part according to a fifth embodiment is mounted on a circuit board.
Figure 10:
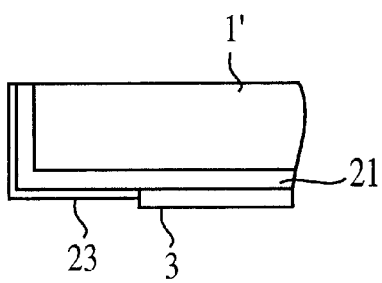
FIG. 10 is a sectional view of a terminal electrode of a conventional electronic part.
Figure 11:
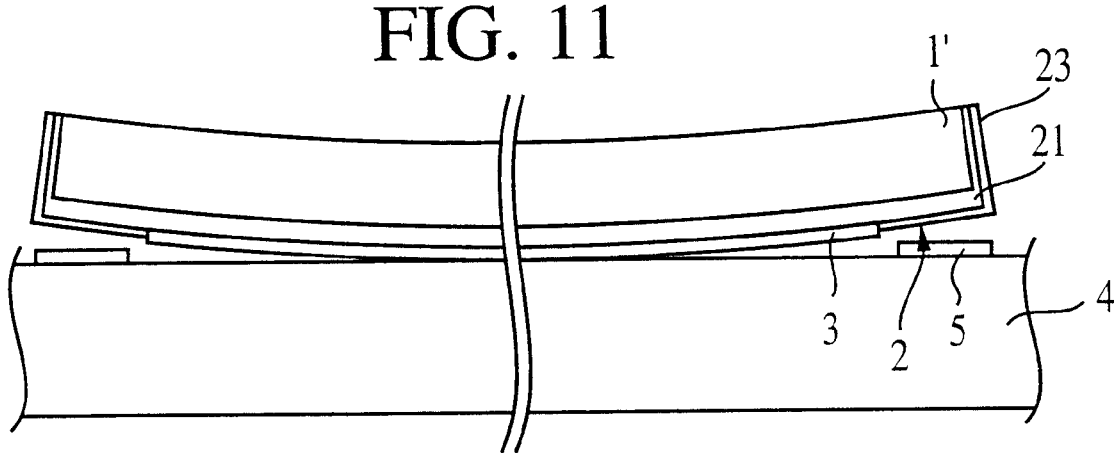
FIG. 11 is a sectional view showing the condition where the electronic part is mounted on a circuit board.

FIG. 9 is a sectional view showing the condition where the dielectric duplexer is mounted on a circuit board. As shown in this example, even when the printed circuit board 1 is warped to some extent in the direction that the terminal electrode 2 of the printed circuit board 1 be lifted out of the circuit board 4, as the lower surface of the terminal electrode 2 is nearly as low as the soldering-resistant film 3, the terminal electrode 2 is not lifted out of the terminal electrode 5 of the circuit board 4.

When the construction of the terminal electrodes as shown in the above is applied to high-frequency filters of dielectric duplexers, etc., as the continuity of the grounding electrode of the upper and lower surfaces of the printed circuit board and the coaxial dielectric resonators is kept because of, for example, the through-holes TH and the grounding electrode 7 on nearly all the lower surface of the printed circuit board 1 shown in FIG. 2, the current path of a high-frequency signal corresponding to the flow of the high-frequency signal is secured. Further, although the soldering-resistant film 3 prevents short circuits to the wiring and electrodes on the circuit board of electronic equipment, the film thickness around the through-holes TH is likely to become thinner which is dependent on printing methods of soldering-resistant films. However, according to the invention, as the thickness of soldering-resistant films can be made thicker to the degree to which the surface of the terminal electrodes has been raised, short circuits to the wiring, etc. on the circuit, board can be securely prevented.

Furthermore, generally the thinner the base material of a printed circuit board is made, the more warped, but according to the present invention as the allowance of warping of the printed circuit board increases the thickness of the printed circuit board can be made as thin as less than 0.5 mm and it becomes possible to lower the height of electronic parts.

Further, in the embodiments shown in the above a dielectric duplexer was taken as an example, but in the same way a dielectric filter can be also constructed by mounting coaxial dielectric resonators on a printed circuit board.

While the invention has been particularly shown and described with reference to preferred embodiments thereof, it will be understood by those skilled in the art that the forgoing and other changes in form and details may be made therein without departing from the spirit of the invention.

What is claimed is:

1. An electronic part comprising:
   a printed circuit board including a first major surface and a second major surface;
   a circuit element disposed on the first major surface of the printed circuit board;
   a terminal electrode disposed on the second major surface of the printed circuit board and including a respective major surface opposed to the second major surface of the printed circuit board;
   a soldering-resistant film disposed on the second major surface of the printed circuit board and including a respective major surface opposed to the second major surface of the printed circuit board;
   wherein the distance between the major surface of the terminal electrode and the second major surface of the printed circuit board is equal to or larger than the distance between the major surface of the soldering-resistant film in the vicinity of the terminal electrode and the second major surface of the printed circuit board whereby the printed circuit board can undergo a degree of warp causing the terminal electrode to be deformed toward the first major surface of the printed circuit board without eliminating the availability of the terminal electrode to solder.

2. The electronic part according to claim 1, wherein:
   a plurality of coaxial dielectric resonators are provided as the circuit element, and a signal input-output terminal is provided as the terminal electrode thereby constituting a dielectric filter.

3. The electronic part according to claim 2, wherein:
   at least two of the dielectric filters are provided on the printed circuit board thereby constituting a dielectric duplexer.

4. A method of manufacturing an electronic part, comprising:
   mounting a circuit element on the first major surface of a printed circuit board;
   disposing a terminal electrode on the second major surface of the printed circuit board, the terminal electrode including a major surface opposed to the second major surface of the printed circuit board;
   disposing a soldering-resistant film on the second major surface of the printed circuit board, the soldering-resistant film including a major surface opposed to the second major surface of the printed circuit board;
   wherein the terminal electrode is formed by disposing an electrode film on the second major surface of the printed circuit board and etching the electrode film excluding the portion of the terminal electrode;
   the soldering-resistant film is disposed on the etched portion of the electrode film; and
   the distance between the major surface of the terminal electrode and the second major surface of the printed circuit board is made substantially equal to or larger than the distance between the major surface of the soldering-resistant film in the vicinity of the terminal electrode and the second major surface of the printed circuit board whereby the printed circuit board can undergo a degree of warp causing the terminal electrode to be deformed toward the first major surface of the printed circuit board without eliminating the availability of the terminal electrode to solder.

5. A method of manufacturing an electronic part, comprising:
   mounting a circuit element on the first major surface of a printed circuit board;
   disposing a terminal electrode on the second major surface of the printed circuit board, the terminal electrode including a major surface opposed to the second major surface of the printed circuit board;
   disposing a soldering-resistant film on the second major surface of the printed circuit board, the soldering-resistant film including a major surface opposed to the second major surface of the printed circuit board;
   wherein the terminal electrode is formed by disposing an electrode film on the second major surface of the printed circuit board and plating the electrode film at the portion of the terminal electrode;
   the soldering-resistant film is disposed on the electrode film excluding the portion of the terminal electrode; and
   the distance between the major surface of the terminal electrode and the second major surface of the printed circuit board is made substantially equal to or larger than the distant film in the vicinity of the terminal electrode and the second major surface of the printed circuit board whereby the printed circuit board can undergo a degree of warp causing the terminal electrode to be deformed toward the first major surface of the printed circuit board without eliminating the availability of the terminal electrode to solder.

* * * * *